US009761646B2

(12) United States Patent
Lee et al.

(10) Patent No.: US 9,761,646 B2
(45) Date of Patent: Sep. 12, 2017

(54) ORGANIC LIGHT-EMITTING DIODE DISPLAY

(71) Applicant: Samsung Display Co., Ltd., Yongin-si, Gyeonggi-do (KR)

(72) Inventors: Seung-Kyu Lee, Asan-si (KR); Chae Han Hyun, Cheonan-si (KR); Ki Myeong Eom, Suwon-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/939,819

(22) Filed: Nov. 12, 2015

(65) Prior Publication Data

US 2016/0322442 A1 Nov. 3, 2016

(30) Foreign Application Priority Data

Apr. 29, 2015 (KR) ........................ 10-2015-0060609

(51) Int. Cl.
*H01L 27/32* (2006.01)
*H01L 29/786* (2006.01)

(52) U.S. Cl.
CPC ...... *H01L 27/3262* (2013.01); *H01L 27/3276* (2013.01); *H01L 29/78696* (2013.01); *H01L 27/3265* (2013.01)

(58) Field of Classification Search
CPC . H01L 27/32; H01L 27/3262; H01L 27/3265; H01L 27/3276; H01L 27/3258
See application file for complete search history.

(56) References Cited

U.S. PATENT DOCUMENTS

2009/0040407 A1 2/2009 Kim
2011/0025585 A1* 2/2011 Kim ..................... G09G 3/3233
345/76

(Continued)

FOREIGN PATENT DOCUMENTS

JP 2009-37100 A 2/2009
KR 10-0570627 B1 4/2006

(Continued)

OTHER PUBLICATIONS

Office Action dated Jan. 19, 2017 for U.S. Appl. No. 14/939,837, and which is related to subject U.S. Appl. No. 14/939,819.

*Primary Examiner* — Phuc Dang
(74) *Attorney, Agent, or Firm* — Knobbe Martens Olson & Bear LLP

(57) ABSTRACT

An organic light-emitting diode display is disclosed. The display includes a semiconductor layer formed over a substrate, a scan line formed over the semiconductor layer and configured to provide a scan signal, and a light emission control line formed over the semiconductor layer and configured to provide a light emission control signal. The display includes a data line configured to provide a data voltage and a driving voltage line configured to provide a driving voltage, wherein the driving voltage line crosses the scan line and is electrically insulated from the scan line. A switching transistor is electrically connected to the scan line and the data line and includes a switching drain electrode. A driving transistor includes a driving source electrode electrically connected to the switching drain electrode. Any one of the semiconductor layer and the light emission control line includes an extension at least partially overlapping the data line.

20 Claims, 9 Drawing Sheets

(56) References Cited

U.S. PATENT DOCUMENTS

| | | | |
|---|---|---|---|
| 2012/0099042 | A1 | 4/2012 | Lee et al. |
| 2013/0328049 | A1 | 12/2013 | Choi et al. |
| 2014/0353629 | A1* | 12/2014 | Jin ............... H01L 27/3262 257/40 |
| 2015/0042634 | A1* | 2/2015 | Jin ............... G09G 3/3648 345/212 |
| 2015/0160523 | A1* | 6/2015 | Fukami ......... G02F 1/136204 349/47 |
| 2015/0200239 | A1 | 7/2015 | Jung et al. |
| 2016/0005804 | A1* | 1/2016 | Oh ............... H01L 51/0562 257/72 |

FOREIGN PATENT DOCUMENTS

| | | |
|---|---|---|
| KR | 10-2012-0110888 A | 10/2012 |
| KR | 10-2014-0108023 A | 5/2014 |
| KR | 10-2014-0077002 A | 6/2014 |
| KR | 10-2014-0086510 A | 7/2014 |

\* cited by examiner

ORGANIC LIGHT-EMITTING DIODE DISPLAY

INCORPORATION BY REFERENCE TO ANY PRIORITY APPLICATIONS

This application claims priority to and the benefit of Korean Patent Application No. 10-2015-0060609 filed in the Korean Intellectual Property Office on Apr. 29, 2015, the entire contents of which are incorporated herein by reference.

This application relates to U.S. patent application entitled "Organic Light-Emitting Diode Display" (application Ser. No. 14/939,837), which is concurrently filed with this application and incorporated herein by reference in its entirety.

BACKGROUND

Field

The described technology generally relates to an organic light-emitting diode display.

Description of the Related Technology

An organic light-emitting diode (OLED) includes two electrodes and an interposed organic emission layer. The OLED forms excitons by combining electrons injected from a cathode electrode with holes injected from an anode electrode at the organic emission layer and emits light by allowing the excitons to emit energy.

An OLED display includes a matrix of pixels where each pixel includes transistors for driving the OLED and a capacitor. The transistors typically include switching transistors and driving transistors.

The driving transistor controls a driving current flowing in the OLED and stores a data voltage in the storage capacitor connected to a driving gate node of the driving transistor. The storage capacitor keeps the stored data voltage for one frame. Therefore, the driving transistor supplies a constant amount of driving current to the OLED for one frame to emit light.

However, a change in voltage of the data line affects a voltage of a driving gate node of the driving transistor due to a parasitic capacitance formed between a driving gate node and a data line connected to a driving gate electrode of the driving transistor. The change in voltage of the driving gate node changes a driving current flowing in the OLED to cause vertical crosstalk which leads to a change in luminance.

To prevent this side effect, a spacing between the data line and the driving gate node positions them as far apart as possible. But as resolution increases, the size of the pixel is reduced. Process design does not allow for continuous reduction due to a limitation of facility specification and photolithography process capability, such that there is a limitation in minimizing the vertical crosstalk.

The above information disclosed in this Background section is only for enhancement of understanding of the background of the described technology and therefore it can contain information that does not form the prior art that is already known in this country to a person of ordinary skill in the art.

SUMMARY OF CERTAIN INVENTIVE ASPECTS

One inventive aspect relates to an OLED display that can minimize a vertical crosstalk in a high resolution structure.

Another aspect is an OLED display including: a substrate; a semiconductor layer positioned on the substrate; a scan line and a light emission control line positioned on the semiconductor layer and each applied with a scan signal and a light emission control signal; a data line applied with a data voltage and a driving voltage line applied with a driving voltage, intersecting the scan line while being insulated from the scan line; a switching transistor connected to the scan line and the data line and including a switching drain electrode; a driving transistor including a driving source electrode which is connected to the switching drain electrode; and an OLED connected to the driving transistor, wherein any one of the semiconductor layer and the light emission control line includes an extension overlapping the data line.

A width of the extension can be wider than that of the data line.

The extension can extend along a length direction of the data line.

The semiconductor layer can be connected to the driving voltage line.

The semiconductor layer can include a switching channel of the switching transistor and a driving channel of the driving transistor.

The driving channel can be curved on a plane.

The OLED display can further include: a first gate insulating layer positioned on the semiconductor layer.

The OLED display can further include: a first storage electrode positioned on the first gate insulating layer and overlapping the driving channel; a second gate insulating layer positioned on the first storage electrode; and a second storage electrode positioned on the second gate insulating layer and overlapping the first storage electrode, wherein the first storage electrode is a driving gate electrode of the driving transistor.

The OLED display can further include: an interlayer insulating layer positioned on the second storage electrode, wherein the data line is positioned on the interlayer insulating layer.

The OLED display can further include: a compensation transistor turned on depending on the scan signal to compensate for a threshold voltage of the driving transistor and connected to a driving drain electrode of the driving transistor.

The OLED display can further include: an operation control transistor turned on by the light emission control signal to transfer the driving voltage to the driving transistor.

The operation control transistor can include: an operation control gate electrode which is a portion of the light emission control line; an operation control channel overlapping the operation control gate electrode and positioned on the semiconductor layer; and an operation control source electrode and an operation control drain electrode positioned on the semiconductor layer and each positioned at both sides of the operation control channel.

The OLED display can further include: a passivation layer positioned on the data line, wherein the OLED includes: a pixel electrode positioned on the passivation layer; an organic emission layer positioned on the pixel electrode; and a common electrode formed on the organic emission layer.

Another aspect is an organic light-emitting diode (OLED) display, comprising: a substrate; a semiconductor layer formed over the substrate; a scan line formed over the semiconductor layer and configured to provide a scan signal; a light emission control line formed over the semiconductor layer and configured to provide a light emission control signal; a data line configured to provide a data voltage; a driving voltage line configured to provide a driving voltage, wherein the driving voltage line crosses the scan line and is electrically insulated from the scan line; a switching transistor electrically connected to the scan line and the data line and including a switching drain electrode; a driving transistor including a driving source electrode electrically connected to the switching drain electrode; and an OLED electrically connected to the driving transistor, wherein any one of the semiconductor layer and the light emission control line includes an extension at least partially overlapping the data line in the depth dimension of the OLED display.

In the above OLED display, the width of the extension is greater than that of the data line.

In the above OLED display, the extension extends in a length direction of the data line.

In the above OLED display, the semiconductor layer is electrically connected to the driving voltage line.

In the above OLED display, the semiconductor layer includes a switching channel of the switching transistor and a driving channel of the driving transistor.

In the above OLED display, the driving channel is curved.

The above OLED display further comprises a first gate insulating layer formed over the semiconductor layer.

The above OLED display further comprises: a first storage electrode formed over the first gate insulating layer and overlapping the driving channel in the depth dimension of the OLED display; a second gate insulating layer formed over the first storage electrode; and a second storage electrode formed over the second gate insulating layer and overlapping the first storage electrode in the depth dimension of the OLED display, wherein the first storage electrode includes a driving gate electrode of the driving transistor.

The above OLED display further comprises an interlayer insulating layer formed over the second storage electrode, wherein the data line is formed over the interlayer insulating layer.

The above OLED display further comprises a compensation transistor configured to be turned on based on the scan signal to compensate for a threshold voltage of the driving transistor, wherein the compensation transistor is electrically connected to a driving drain electrode of the driving transistor.

The above OLED display further comprises an operation control transistor configured to receive the light emission control signal and configured to be turned on to transfer the driving voltage to the driving transistor.

In the above OLED display, the operation control transistor includes: a portion of the light emission control line configured to function as an operation control gate electrode of the operation control transistor; an operation control channel overlapping the operation control gate electrode in the depth dimension of the OLED display and formed over the semiconductor layer; and operation control source and drain electrodes formed over the semiconductor layer and located on different sides of the operation control channel.

The above OLED display further comprises a passivation layer formed over the data line, wherein the OLED includes: a pixel electrode formed over the passivation layer; an organic emission layer formed over the pixel electrode; and a common electrode formed over the organic emission layer.

The above OLED display further comprises the extension does not overlap the scan line in the depth dimension of the OLED display.

Another aspect is an organic light-emitting diode (OLED) display, comprising: a semiconductor layer; a scan line formed over the semiconductor layer and configured to provide a scan signal; a data line configured to, provide a data voltage; an OLED electrically connected to the driving transistor, wherein the semiconductor layer includes an extension overlapping the data line in the depth dimension of the OLED display.

In the above OLED display, the extension does not overlap the scan line in the depth dimension of the OLED display.

In the above OLED display, the width of the extension is greater than that of the data line.

The above OLED display further comprises an operation control transistor including an operation control gate electrode formed on the same layer as the first extension.

In the above OLED display, the operation control gate electrode has a width less than the width of the extension.

In the above OLED display, the extension extends from the semiconductor layer and is substantially parallel to the data line.

According to at least one of the disclosed embodiments, it is possible to minimize the parasitic capacitance from occurring between the scan line and the data line by positioning the semiconductor layer or a portion of the light emission control line between the scan line and the data line. Therefore, it is possible to minimize the vertical crosstalk by minimizing the kick back voltage due to the parasitic capacitor to make the change in the driving gate voltage Vg of the driving gate electrode small Further, it is possible to expand the driving range of the driving gate-source voltage Vgs between the driving gate electrode and the driving source electrode by minimizing the kickback voltage due to the parasitic capacitor to increase the data voltage. Therefore, it is possible to increase the resolution of the OLED display and improve the display quality by more elaborately controlling the gray scale of light emitted from the OLED (OLD).

DETAILED DESCRIPTION OF CERTAIN INVENTIVE EMBODIMENTS

Figure 1:
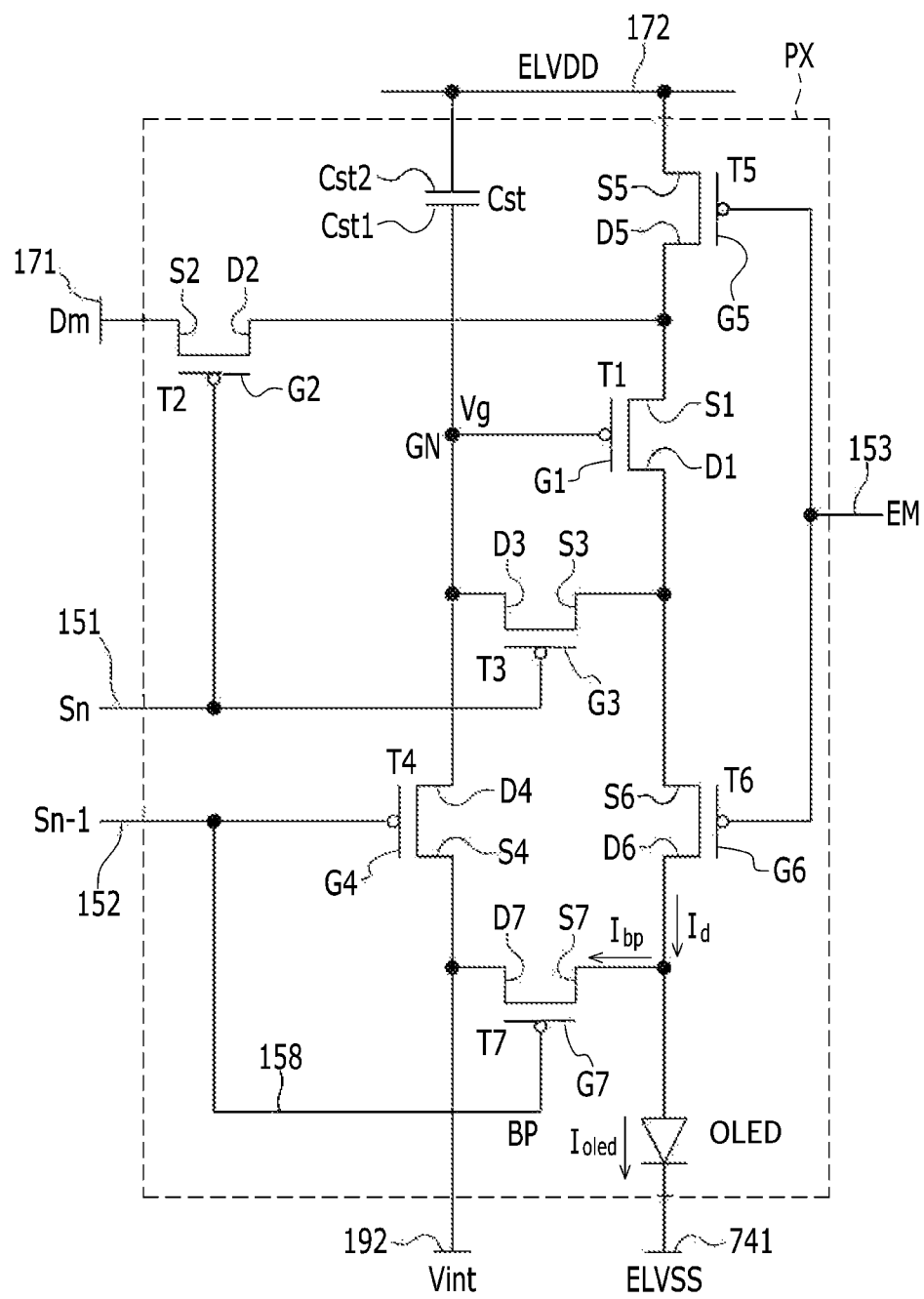
FIG. 1 is an equivalent circuit diagram of one pixel of an OLED display according to an exemplary embodiment.

The described technology will be described more fully hereinafter with reference to the accompanying drawings, in which exemplary embodiments are shown. As those skilled in the art would realize, the described embodiments can be modified in various different ways, all without departing from the spirit or scope of the described technology.

Accordingly, the drawings and description are to be regarded as illustrative in nature and not restrictive. Like reference numerals designate like elements throughout the specification.

In addition, the size and thickness of each configuration shown in the drawings are arbitrarily shown for understanding and ease of description, but the described technology is not limited thereto. In the drawings, the thickness of layers, films, panels, regions, etc., are exaggerated for clarity. In the drawings, for understanding and ease of description, the thickness of some layers and areas is exaggerated.

In addition, unless explicitly described to the contrary, the word "comprise" and variations such as "comprises" or "comprising", will be understood to imply the inclusion of stated elements but not the exclusion of any other elements. Further, throughout the present specification, it will be understood that when an element such as a layer, film, region, or substrate is referred to as being "on" another element, it can be directly on the other element or intervening elements can also be present. Further, in the specification, the word "~on" or "~over" means positioning on or below the object portion, but does not essentially mean positioning on the upper side of the object portion based on a gravity direction.

Further, throughout the specification, the word "on plane" means viewing an object portion from the top and the word "on section" means viewing a section of an object portion, which is vertically taken along, from a side. In this disclosure, the term "substantially" includes the meanings of completely, almost completely or to any significant degree under some applications and in accordance with those skilled in the art. The term "connected" can include an electrical connection.

Further, the number of thin film transistors (TFTs) and capacitors is not limited to the number illustrated in the accompanying drawings and an OLED display can be formed in various structures in which one pixel can include a plurality of transistors and at least one capacitor and is further provided with a separate wiring or does not include the existing wirings. Here, the pixel means a minimum unit which displays an image and the OLED display displays an image through a plurality of pixels.

Hereinafter, an OLED display according to an exemplary embodiment will be described in detail with reference to the accompanying drawings. FIG. 1 is an equivalent circuit diagram of one pixel of an OLED display according to an exemplary embodiment.

As illustrated in FIG. 1, the OLED display according to the exemplary embodiment includes a plurality of signal lines 151, 152, 153, 158, 171, 172, and 192 and a plurality of pixels PXs which are connected to the signal lines and are arranged in approximately a matrix form.

One pixel PX includes a plurality of transistors T1, T2, T3, T4, T5, T6, and T7 which are connected to the signal lines 151, 152, 153, 158, 171, 172, and 192, a storage capacitor Cst, and an organic light-emitting diode (OLED).

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 192 includes a scan line 151 which transfers a scan signal Sn, a previous scan line 152 which transfers a previous scan signal Sn-1 to the initialization transistor T4, a light emission control line 153 which transfers a light emission control signal EM to the operation control transistor T5 and the light emission control transistor T6, a bypass control layer 158 which transfers a bypass signal BP to the bypass transistor T7, a data line 171 which intersects the scan line 151 and transfers a data signal Dm, a driving voltage line 172 which transfers a driving voltage ELVDD and is formed in approximately parallel with the data line 171, and an initialization voltage line 192 which transfers an initialization voltage Vint initializing the driving transistor T1.

A gate electrode G1 of the driving transistor T1 is connected to one terminal Cst1 of the storage capacitor Cst, a source electrode S1 of the driving transistor T1 is connected to the driving voltage line 172 via the operation control transistor T5, and a drain electrode D1 of the driving transistor T1 is electrically connected to an anode of the OLED via the light emission control transistor T6. The driving transistor T1 receives the data signal Dm depending on a switching operation of the switching transistor T2 to supply a driving current Id to the OLED.

A gate electrode G2 of the switching transistor T2 is connected to the scan line 151, and a source electrode S2 of the switching transistor T2 is connected to the data line 171. A drain electrode D2 of the switching transistor T2 is connected to the driving voltage line 172 via the operation control transistor T5, while being connected to the source electrode S1 of the driving transistor T1. The switching transistor T2 is turned on depending on the scan signal Sn which is transferred through the scan line 151 to perform a switching operation of transferring the data signal Din transferred to the data line 171 to the source electrode S1 of the driving transistor T1.

A gate electrode G3 of the compensation transistor T3 is connected to the scan line 151, a source electrode S3 of the compensation transistor T3 is connected to the anode of the OLED via the light emission control transistor T6 while being connected to the drain electrode D1 of the driving transistor T1, a drain electrode D3 of the compensation transistor T3 is connected to a drain electrode D4 of the initialization transistor T4, one terminal Cst1 of the storage capacitor Cst, and the gate electrode G1 of the driving transistor T1 together. The compensation transistor T3 is turned on depending on the scan signal Sn which is transferred through the scan line 151 to connect between the gate electrode G1 and the drain electrode D1 of the driving transistor T1 so as to be diode-connected to the driving transistor T1.

A gate electrode G4 of the initialization transistor T4 is connected to the previous scan line 152, the source electrode S4 of the initialization transistor T4 is connected to the initialization voltage line 192, and the drain electrode D4 of the initialization transistor T4 is connected to one terminal Cst1 of the storage capacitor Cst via the drain electrode of the compensation transistor T3 and the gate electrode G1 of the driving transistor T1 together. The initialization transistor T4 is turned on depending on the previous scan signal Sn-1 which is transferred through the previous scan line 152 to transfer the initialization voltage Vint to the gate electrode G1 of the driving transistor T1 so as to perform the initialization operation which initializes a gate voltage Vg of the gate electrode G1 of the driving transistor T1.

A gate electrode G5 of the operation control transistor T5 is connected to the light emission control line 153, the source electrode S5 of the operation control transistor T5 is connected to the driving voltage line 172, and the drain electrode D5 of the operation control transistor T5 is connected to the source electrode S1 of the driving transistor T1 and the drain electrode D2 of the switching transistor T2.

A gate electrode G6 of the light emission control transistor T6 is connected to the light emission control line 153, a source electrode S6 of the light emission control transistor T6 is connected to the drain electrode D1 of the driving transistor T1 and the source electrode S3 of the compensation transistor T3, and a drain electrode D6 of the light emission control transistor T6 is electrically connected to the anode of the OLED. The operation control transistor T5 and the light emission control transistor T6 are substantially simultaneously (or concurrently) turned on depending on the light emission control signal EM which is transferred through the light emission control line 153 and thus the driving voltage ELVDD is compensated by the diode-connected driving transistor T1 and then is transferred to the OLED.

A gate electrode G7 of the bypass transistor T7 is connected to the bypass control line 158, a source electrode S7 of the bypass transistor T7 is connected to the drain electrode D6 of the light emission control transistor T6 and the anode of the OLED together, and a drain electrode D7 of the bypass transistor T7 is connected to the initialization voltage line 192 and the source electrode S4 of the initialization transistor T4 together.

The other terminal Cst2 of the storage capacitor Cst is connected to the driving voltage line 172 and a cathode of the OLED is connected to the common voltage line 741 through which a common voltage ELVSS is transferred.

Meanwhile, the exemplary embodiment describes a 7tr 1 cap (7 transistor, 1 capacitor) structure including the bypass transistor T7 but is not limited thereto and therefore the number of transistors and the number of capacitors can be variously changed.

Figure 2:
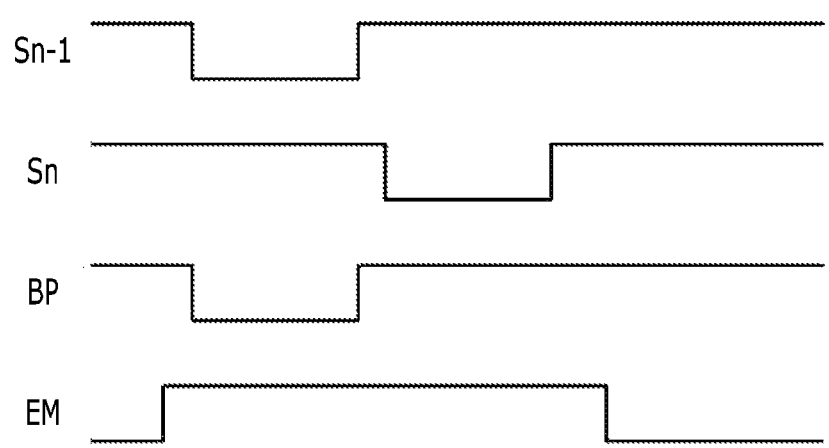
FIG. 2 is a timing diagram of a signal applied to a pixel of the OLED display according to the exemplary embodiment.

Hereinafter, a detailed operation process of one pixel of the OLED display according to the exemplary embodiment will be described in detail with reference to FIG. 2. FIG. 2 is a timing diagram of a signal applied to a pixel of the OLED display according to the exemplary embodiment.

As illustrated in FIG. 2, first, a low-level previous scan signal Sn-1 is supplied through the previous scan line 152 for an initialization period. Next, the initialization transistor T4 is turned on depending on the low-level previous scan signal Sn-1, the initialization voltage Vint is connected to the gate electrode G1 of the driving transistor T1 from the initialization voltage line 192 through the initialization transistor T4, and the driving transistor T1 is initialized by the initialization voltage Vint.

Next, the low-level scan signal Sn is supplied through the scan line 151 for a data programming period Next, the switching transistor T2 and the compensation transistor T3 are turned on depending on the low-level scan signal Sn. In this case, the driving transistor T1 is diode-connected by the turned on compensation transistor T3 and is biased forward.

Next, a compensation voltage Dm+Vth (Vth is a negative value), where the data signal Dm supplied from the data line 171 is added by a threshold voltage (Vth) of the driving transistor T1, is applied to the gate electrode G1 of the driving transistor T1. That is, the gate voltage Vg which is applied to the gate electrode G1 of the driving transistor T1 is the compensation voltage Dm+Vth.

The driving voltage ELVDD and the compensation voltage Dm+Vth is applied to both terminal of the storage capacitor Cst and a charge corresponding to the difference in voltage between both terminals of the storage capacitor Cst is stored in the storage capacitor Cst.

Next, the light emission control signal EM supplied from the light emission control line 153 is changed from a high level to a low level for an emission period. Next, the operation control transistor T5 and the light emission control transistor T6 are turned on by the low-level light emission control signal EM for the emission period.

Next, a driving current Id corresponding to a voltage difference between the gate voltage Vg of the gate electrode G1 of the driving transistor T1 and the driving voltage ELVDD is generated and the driving current Id is supplied to the OLED through the light emission control transistor T6. A driving gate-source voltage Vgs of the driving transistor T1 is maintained at '(Dm+Vth)–ELVDD' by the storage capacitor Cst for the emission period and depending on a current-voltage relationship of the driving transistor T1, the driving current Id is substantially proportional to a square '$(Dm-ELVDD)^2$' of a value obtained by subtracting the threshold voltage from the driving gate-source voltage. Therefore, the driving current Id is determined independent of the threshold voltage Vth of the driving transistor T1.

In this case, the bypass transistor T7 receives a bypass signal BP from the bypass control line 158. Therefore, some of the driving current Id exit through the bypass transistor T7 as a bypass current Ibp.

When the OLED emits light even though a minimum current of the driving transistor T1 displaying a black image flows as a driving current, the black image is not properly displayed. Therefore, the bypass transistor T7 of the foldable display device according to the exemplary embodiment can disperse some of the minimum current of the driving transistor T1 to other current paths other than a current path to the OLED as the bypass current Ibp. Here, the minimum current of the driving transistor T1 means a current under the condition that the driving gate-source voltage Vgs of the driving transistor T1 is less than the threshold voltage Vth and thus the driving transistor T1 is turned off. The minimum driving current (e.g., current which is equal to or less than about 10 pA) under the condition that the driving transistor T1 is turned off is transferred to the OLED and is represented by an image of black luminance. When the minimum driving current representing the black image flows, the effect of the bypass transfer of the bypass current Ibp is large but when a large driving current representing an image like a general image or a white image flows, an effect of the bypass current Ibp can be little. Therefore, when the driving current representing the black image flows, a light emitting current Ioled of the OLED which is reduced as much as a current amount of the bypass current Ibp which exits from the driving current Id through the bypass transistor T7 has a minimum current amount so as to certainly represent the black image. Therefore, the accurate black luminance image is achieved by using the bypass transistor T7 to improve a contrast ratio. In FIG. 2, the bypass signal BP is the same as the previous scan signal Sn-1, but is not necessarily limited thereto.

Hereinafter, the detailed structure of the OLED display illustrated in FIGS. 1 and 2 will be described in detail with reference to FIGS. 3 to 7.

Figure 3:
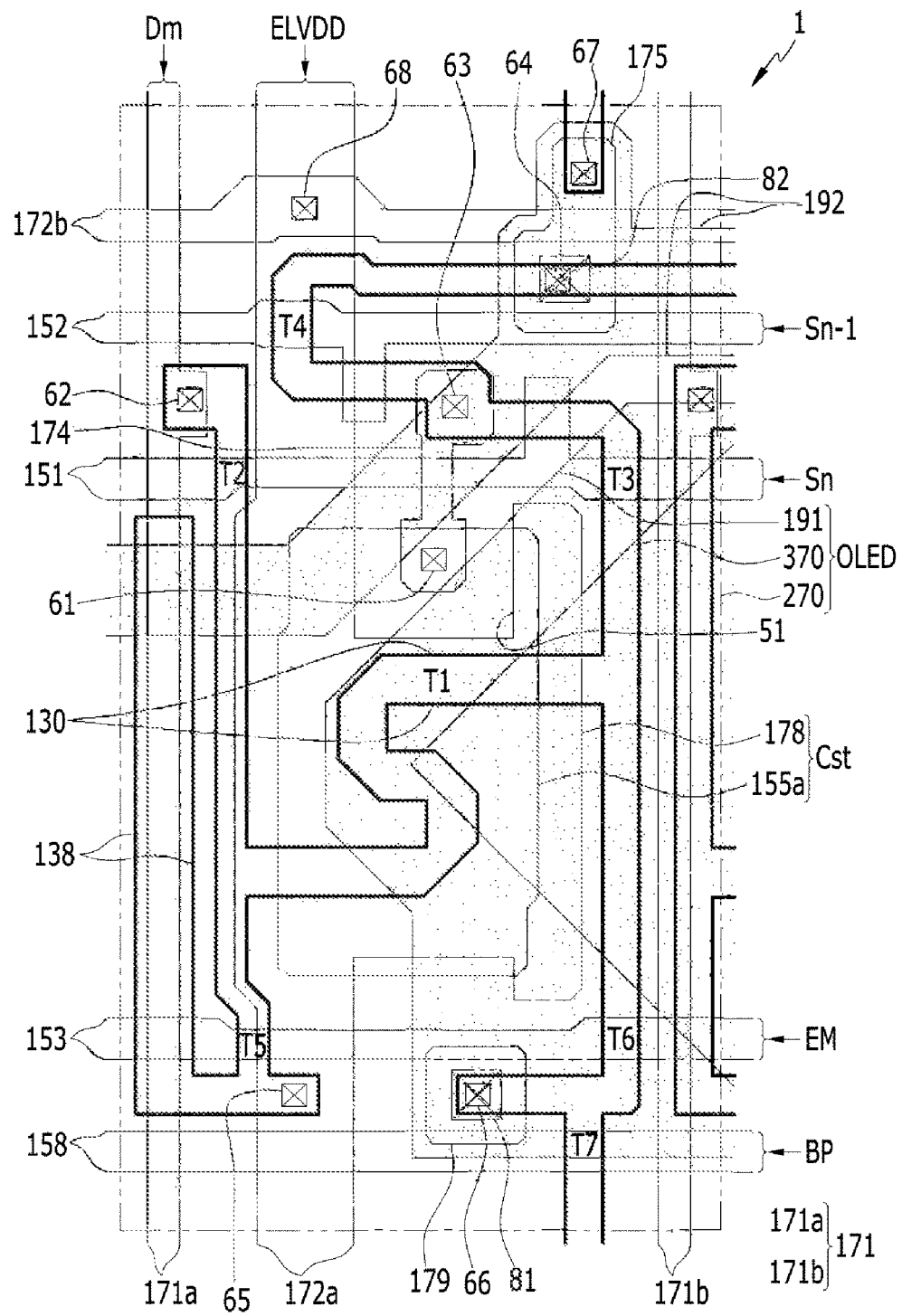
FIG. 3 is a diagram schematically illustrating a plurality of transistors and a capacitor of an OLED display according to an exemplary embodiment.
Figure 4:
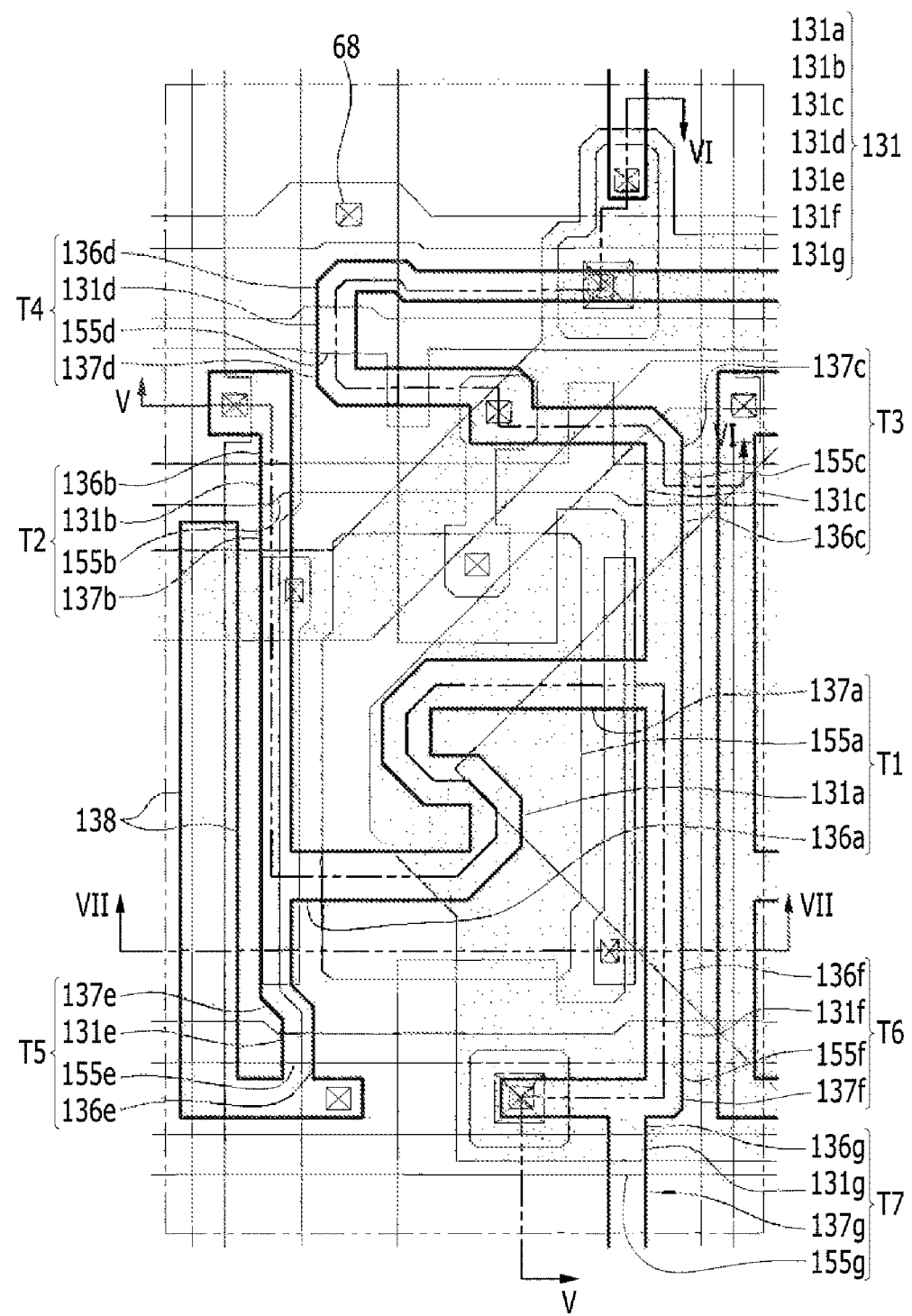
FIG. 4 is a detailed layout view of FIG. 3.
Figure 5:
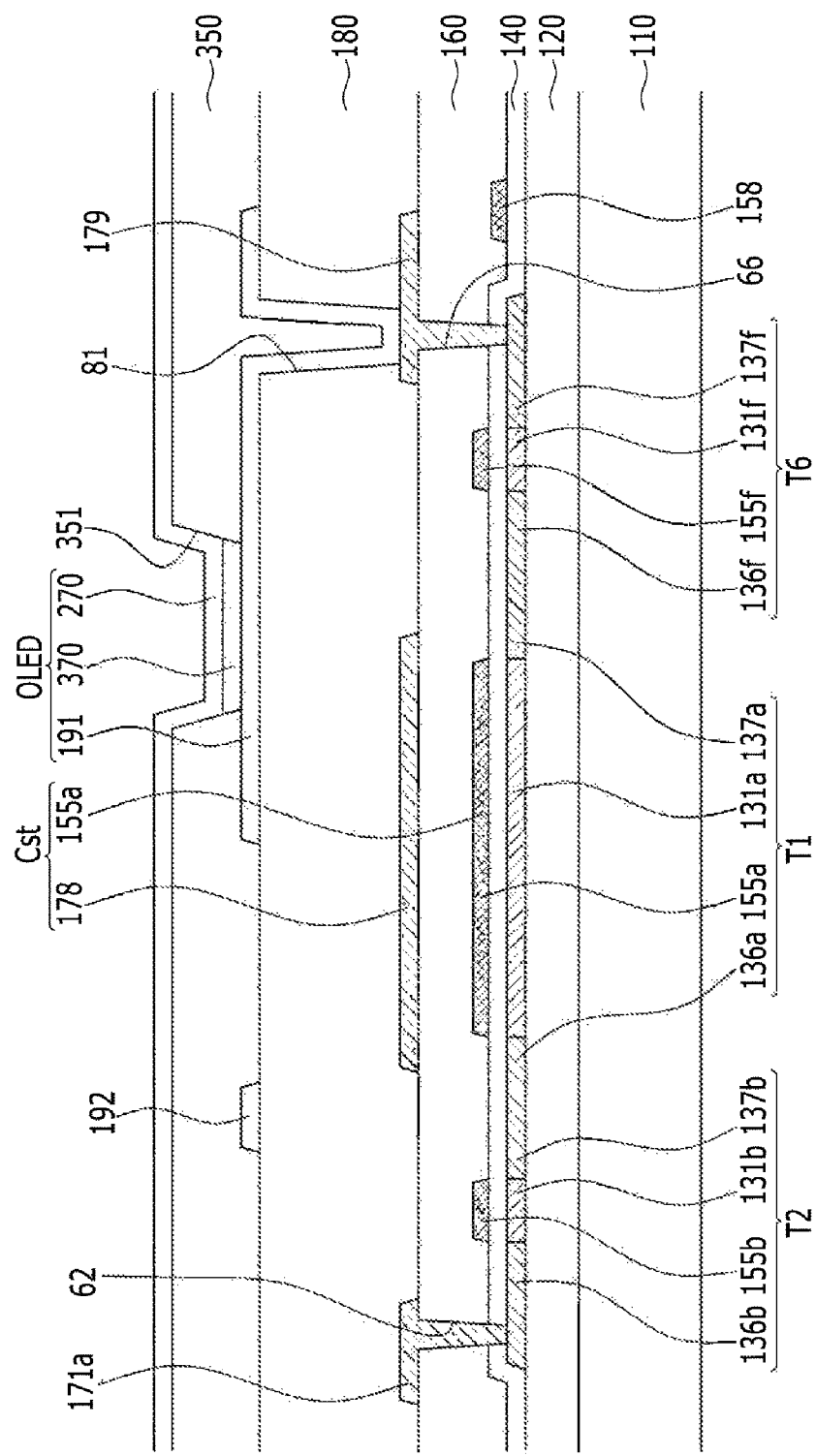
FIG. 5 is a cross-sectional view of the OLED display of FIG. 4 taken along the line V-V.
Figure 6:
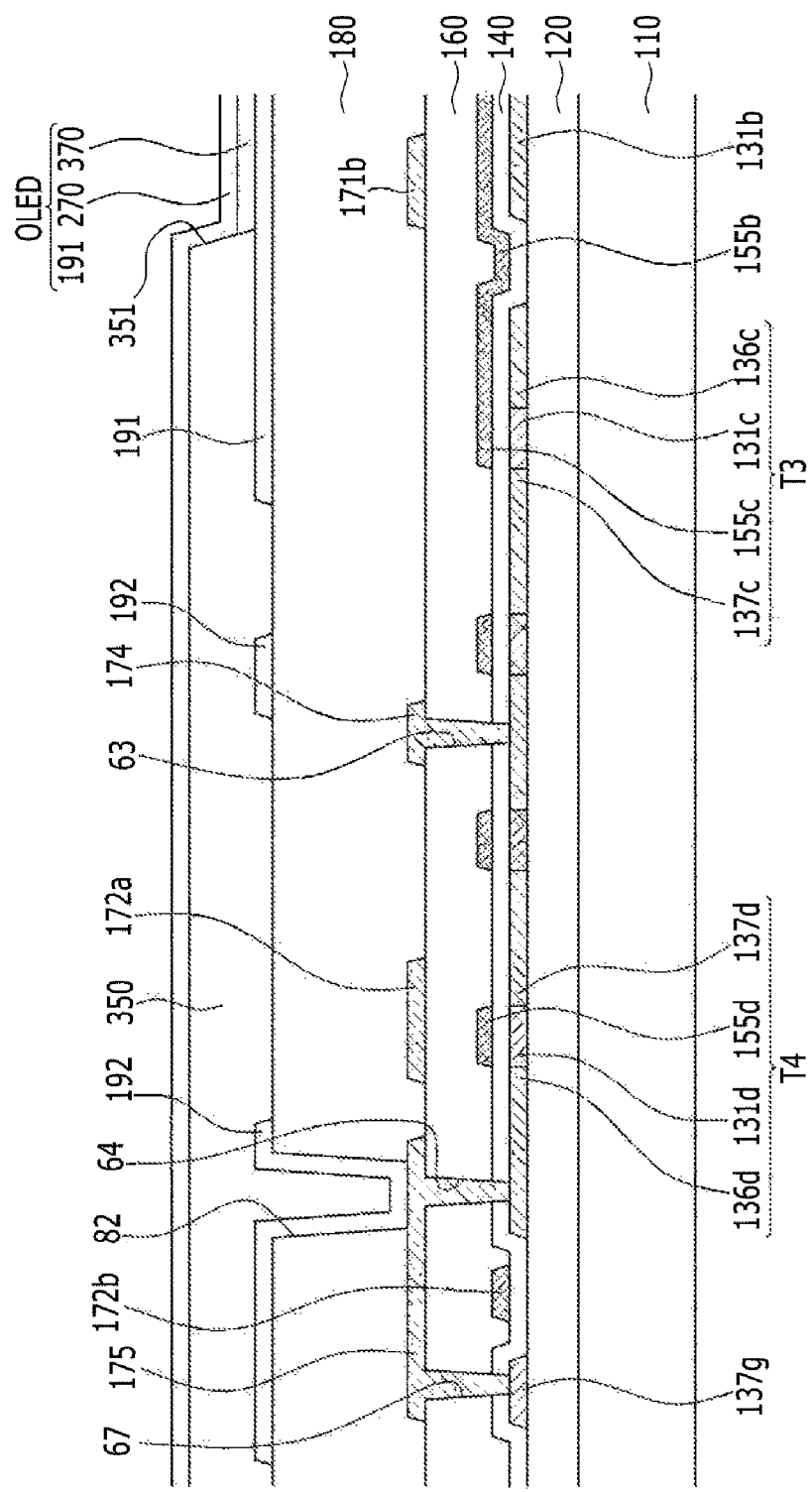
FIG. 6 is a cross-sectional view of the OLED display of FIG. 4 taken along the line VI-VI.
Figure 7:
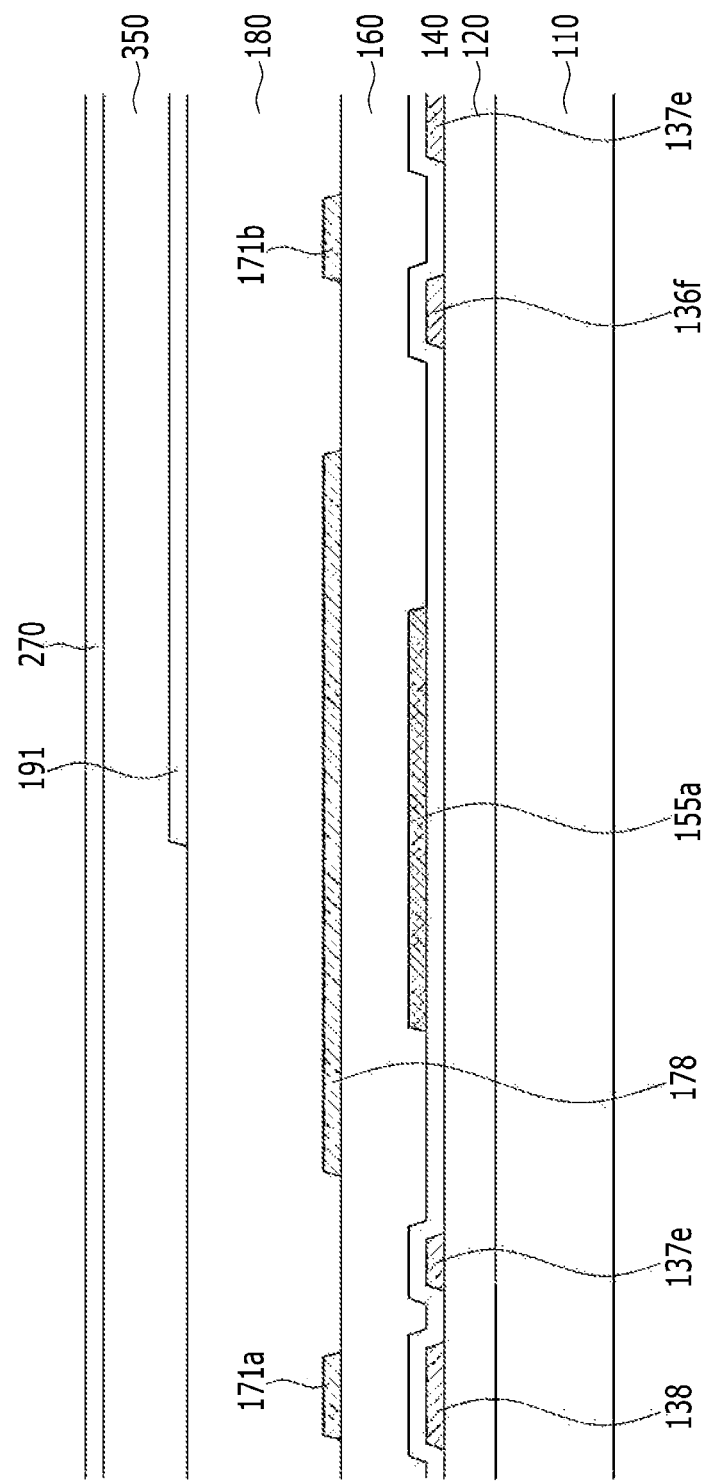
FIG. 7 is a cross-sectional view of the OLED display of FIG. 4 taken along the line VII-VII.

FIG. 3 is a diagram schematically illustrating a plurality of transistors and a capacitor of an OLED display according to an exemplary embodiment. FIG. 4 is a detailed layout view of FIG. 3. FIG. 5 is a cross-sectional view of the OLED display of FIG. 4 taken along the line V-V. FIG. 6 is a cross-sectional view of the OLED display of FIG. 4 taken along the line VI-VI. FIG. 7 is a cross-sectional view of the OLED display of FIG. 4 taken along the line VII-VII.

As illustrated in FIGS. 3 and 4, the OLED display according to the exemplary embodiment applies the scan signal Sn, the previous scan signal Sn-1, the light emission control signal EM, and the bypass signal BP respectively to the scan line 151, the previous scan line 152, the light emission control line 153, and the bypass control line 158 which are formed along a row direction. Further, the pixel unit P1 includes the data line 171 and the driving voltage line 172 which intersect the scan line 151, the previous scan line 152, the light emission control line 153, and the bypass control line 158 and applies the data signal Dm and the driving voltage ELVDD to the pixel 1, respectively. The driving voltage line 172 is configured of a first driving voltage line 172a parallel with the data line 171 and a second driving voltage line 172b parallel with the scan line 151. The first driving voltage line 172a and the second driving voltage line 172b are connected to each other through a contact hole 68.

The initialization voltage Vint is transferred from the initialization voltage line 192 to the compensation transistor T3 via the initialization transistor T4. The initialization voltage line 192 alternately has a straight line portion and an oblique line portion.

Further, the pixel PX is provided with the driving transistor T1, the switching transistor T2, the compensation transistor T3, the initialization transistor T4, the operation control transistor T5, the light emission control transistor T6, the bypass transistor T7, the storage capacitor Cst, and the OLED.

The OLED includes a pixel electrode 191, an organic emission layer 370, and a common electrode 270. In this case, the compensation transistor T3 and the initialization transistor T4 are configured of a transistor having a dual gate structure to cut off a leakage current.

Each channel of the driving transistor T1, the switching transistor T2, the compensation transistor T3, the initialization transistor T4, the operation control transistor T5, the light emission control transistor T6, and the bypass transistor T7 is formed inside one connected semiconductor 130 which can be curved in various shapes.

The semiconductor layer 130 can be formed of a polycrystalline semiconductor material or an oxide semiconductor material. The oxide semiconductor can include any one of an oxide of titanium (Ti), hafnium (Hf), zirconium (Zr), aluminum (Al), tantalum (Ta), germanium (Ge), zinc (Zn), gallium (Ga), tin (Sn), or indium (In), and an indium-gallium-zinc oxide (InGaZnO$_4$), an indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O), which are composite oxides thereof. When the semiconductor layer 130 is formed of the oxide semiconductor, a separate protective layer can be added to protect the oxide semiconductor material which is vulnerable to external environments, such as high temperature.

The semiconductor 130 includes a channel which is channel-doped with N-type impurity or P-type impurity. The semiconductor 130 also includes a source doping area and a drain doping area which are formed at both sides of the channel and have a doping concentration greater than that of the doping impurity which is doped in the channel. According to the exemplary embodiment of the exemplary embodiment, the source doping area and the drain doping area each correspond to the source electrode and the drain electrode. The source electrode and the drain electrode which are formed in the semiconductor 130 can be formed by doping only the corresponding area. Further, the area between the source electrodes and the drain electrodes of different transistors in the semiconductor 130 is doped, and thus the source electrodes can be electrically connected to the drain electrodes.

As illustrated in FIG. 4, a channel 131 includes a driving channel 131a which is formed in the driving transistor T1, a switching channel 131b which is formed in the switching transistor T2, a compensation channel 131c which is formed in the compensation transistor T3, an initialization channel 131d which is formed in the initialization transistor T4, an operation control channel 131e which is formed in the operation control transistor T5, a light emission control channel 131f which is formed in the light emission control transistor T6, and a bypass channel 131g which is formed in the bypass transistor T7.

The driving transistor T1 includes the driving channel 131a, a driving gate electrode 155a, a driving source electrode 136a, and a driving drain electrode 137a. The driving channel 131a can be curved and can have a meandering shape or a zigzag shape. As such, as the driving channel 131a is formed in the bent shape a narrow space thereof can be formed to be long with the driving channel 131a. Therefore, a driving range of the driving gate-source voltage Vgs between the driving gate electrode 155a and the driving source electrode 136a is widened by the long formed driving channel 131a. Since the driving range of the driving gate-source voltage Vgs is wide, it is possible to more delicately control gray scale of light emitted from the OLED by changing a magnitude of the gate-source voltage Vgs, thereby increasing a resolution of the OLED display and improving a display quality. The shape of the driving channel 131a is variously changed and thus various exemplary embodiments such as 'reverse S', 'S', 'M', 'W', and the like can be possible.

The driving gate electrode 155a overlaps the driving channel 131a and the driving source electrode 136a and the driving drain electrode 137a are each formed at both sides of the driving channel 131a, while being adjacent to each other. The driving gate electrode 155a is connected to a driving connecting member 174 through a contact hole 61.

The switching transistor T2 includes a switching channel 131b, a switching gate electrode 155b, a switching source electrode 136b, and a switching drain electrode 137b. The switching gate electrode 155b which is some of the portion extending downward from the scan line 151 overlaps the switching channel 131b and the switching source electrode 136b and the switching drain electrode 137b are each formed at both sides of the switching channel 131b, while being adjacent to each other. The switching source electrode 136b is connected to the data line 171 through a contact hole 62.

The compensation transistor T3 includes a compensation channel 131c, a compensation gate electrode 155c, a compensation source electrode 136c, and a compensation drain electrode 137c. The compensation gate electrode 155c which is a portion of the scan line 151 is formed in two to prevent a current from being leaked and overlaps the compensation channel 131*c*. The compensation source electrode 136*c* and the compensation drain electrode 137*c* each are adjacently formed to both sides of the compensation channel 131*c*. The compensation drain electrode 137*c* is connected to the driving connecting member 174 through a contact hole 63.

The initialization transistor T4 includes the initialization channel 131*d*, the initialization gate electrode 155*d*, the initialization source electrode 136*d*, and the initialization drain electrode 137*d*. The initialization gate electrode 155*d* which is a portion of the previous scan line 152 is formed in two to prevent a current from being leaked and overlaps the initialization channel 131*d*. The initialization source electrode 136*d* and the initialization drain electrode 137*d* each are adjacently formed to both sides of the initialization channel 131*d*. The initialization source electrode 136*d* is connected to the initialization connecting member 175 through a contact hole 64.

The operation control transistor T5 includes an operation control channel 131*e*, an operation control gate electrode 155*e*, an operation control source electrode 136*e*, and an operation control drain electrode 137*e*. The operation control gate electrode 155*e*, which is a portion of the light emission control line 153, overlaps the operation control channel 131*e*. The operation control source electrode 136*e* and the operation control drain electrode 137*e* are each formed at both sides of the operation control channel 131*e* while being adjacent to each other. The operation control source electrode 136*e* is connected to the driving voltage line 172*a* through a contact hole 65.

The light emission control transistor T6 includes a light emission control channel 131*f*, a light emission control gate electrode 155*f*, a light emission control source electrode 136*f*, and a light emission control drain electrode 137*f*. The light emission control gate electrode 155*f*, which is a portion of the light emission control line 153, overlaps the light emission control channel 131*f*. The light emission control source electrode 136*f* and the light emission control drain electrode 137*f* are each formed at both sides of the light emission control channel 131*f* while being adjacent to each other. The light emission control drain electrode 137*f* is connected to the light emission control connecting member 179 through the contact hole 66.

The bypass transistor T7 includes a bypass channel 131*g*, a bypass gate electrode 155*g*, a bypass source electrode 136*g*, and a bypass drain electrode 137*g*. The bypass gate electrode 155*g*, which is a portion of the bypass control line 158, overlaps the bypass channel 131*g*. The bypass source electrode 136*g* and the bypass drain electrode 137*g* are each formed at both sides of the bypass channel 131*g*, while being adjacent to each other.

The bypass source electrode 136*g* is directly connected to the light emission control drain electrode 137*f* and the bypass drain electrode 137*g* is connected to the initialization source electrode 136*d* through a contact hole 67.

One end of the driving channel 131*a* of the driving transistor T1 is connected to the switching drain electrode 137*b* and the operation control drain electrode 137*e*. The other end of the driving channel 131*a* is connected to the compensation source electrode 136*c* and the light emission control source electrode 136*f*.

The storage capacitor Cst includes the first storage electrode 155*a* and the second storage electrode 178 formed, having the interlayer insulating layer 160 formed therebetween. The first storage electrode 155*a* corresponds to the driving gate electrode 155*a* and the second storage electrode 178 is an extended area of the first driving voltage line 172*a* and is formed in each pixel one by one. Here, the interlayer insulating layer 160 is a dielectric material and storage capacitance is determined by a charge charged in the storage capacitor Cst and a voltage between both capacitors 155*a* and 156. As such, the driving gate electrode 155*a* is used as the first storage electrode 155*a*, and thus a space in which the storage capacitor can be formed can be secured in a narrowing space due to the driving channel 131*a* occupying a large area within the pixel.

The first storage electrode 155*a* which is the driving gate electrode 155*a* is connected to one end of the driving connecting member 174 through the contact hole 61 and the storage opening 51. The storage opening 51 is formed in the second storage electrode 178. Therefore, an inside of the storage opening 51 is provided with the contact hole 61 through which one end of the driving connecting member 174 is connected to the driving gate electrode 155*a*. The driving connecting member 174 is formed on the same layer to be approximately parallel with the data line 171, and the other end of the driving connecting member 174 is connected to the compensation drain electrode 137*c* of the compensation transistor T3 and the initialization drain electrode 137*d* of the initialization transistor T4 through the contact hole 63. Therefore, the driving connecting member 174 connects between the driving gate electrode 155*a* and the compensation drain electrode 137*c* of the compensation transistor T3 and the initialization drain electrode of the initialization transistor T4. The driving connecting member 174 corresponds to a driving gate node GN which is illustrated in an equivalent circuit diagram of FIG. 1.

The second storage electrode 178 is an extension extended from the first driving voltage line 172*a*. Therefore, the storage capacitor Cst stores the storage capacitance corresponding to the difference between the driving voltage ELVDD transferred to the second storage electrode 178 through the driving voltage line 172 and the driving gate voltage Vg of the driving gate electrode 155*a*.

The data line 171 extends in a column direction while intersecting the scan line 151 and the driving voltage line 172 extends in a column direction while being spaced apart from the data line 171.

The data line 171 includes the first data line 171*a* through which the data signal Dm is transferred to the present pixel and the second data line 171*b* through which a subsequent data signal Dm+1 is transferred to adjacent pixels. The first data line 171*a* and the second data line 171*b* are positioned to be adjacent to each other.

Meanwhile, the second driving voltage line 172*b* is connected to the first driving voltage line 172*a* through a contact hole 68. As such, the driving voltage line 172 is connected to the first driving voltage line 172*a* in a vertical direction and a second driving voltage line 172*b* in a horizontal direction to form a mesh structure, thereby preventing the voltage drop of the driving voltage ELVDD.

A quadrangular light emission control connecting member 179 is connected to the pixel electrode 191 through a contact hole 81 and the quadrangular initialization connecting member 175 is connected to the initialization voltage line 192 through a contact hole 82.

Hereinafter, the section structure of the OLED display according to the exemplary embodiment will be describe in detail according to the stacked structure with reference to FIGS. 5 and 6. In this case, the operation control transistor T5 is substantially the same as the stacked structure of the light emission control transistor T6 and therefore a detailed description thereof will be omitted.

A buffer layer 120 is formed on the substrate 120. The substrate 110 can be formed as an insulating substrate which is formed of glass, quartz, ceramic, plastic, or the like.

The buffer layer 120 serves to block impurity from the substrate 110 to improve characteristics of polycrystalline silicon at the time of the crystallization process for forming polycrystalline silicon and planarizes the substrate 110 to mitigate stress of the semiconductor formed on the buffer layer 120. The buffer layer 120 can be formed of silicon nitride (SiNx), silicon oxide $SiO_2$, or the like.

The semiconductor which includes the channel including the driving channel 131a, the switching channel 131b, the compensation channel 131c, the initialization channel 131d, the operation control channel 131e, the light emission control channel 131f, and the bypass channel 131g is formed on the buffer layer 120.

The driving source electrode 136a and the driving drain electrode 137a are formed at both sides of the driving channel 131a among the semiconductor 130. The switching source electrode 136b and the switching drain electrode 137b are formed at both sides of the switching channel 131b. Further, the compensation source electrode 136c and the compensation drain electrode 137c are formed at both sides of the compensation channel 131c. The initialization source electrode 136d and the initialization drain electrode 137d are formed at both sides of the initialization channel 131. Further, the operation control source electrode 136e and the operation control drain electrode 137e are formed at both sides of the operation control channel 131e. The light emission control source electrode 136f and the light emission control drain electrode 137f are formed at both sides of the light emission control channel 131f. The bypass source electrode 136g and the bypass drain electrode 137g are formed at both sides of the bypass channel 131g.

As illustrated in FIG. 3, the semiconductor 130 according to the exemplary embodiment includes a first extension 138 which overlaps the data line 171. The first extension 138 extends in a length direction of the data line 171 to overlap the data line 171. That is, a portion of the data line 171 overlaps the semiconductor 130. In this case, the first extension 138 can extend from the operation control source electrode 136e.

In this case, a width of the first extension 138 can be greater than that of the data line 171. For example, the width of the data line 171 can be narrower than that of the first extension 138, and the data line 171 can completely overlap the first extension 138 in a width direction.

Meanwhile, the parasitic capacitor Ca occurs between the data line 171 and the scan line 151. The parasitic capacitor Ca changes the driving gate voltage Vg of the driving gate electrode 155a to affect luminance, thereby generating the vertical crosstalk.

However, according to the exemplary embodiment, the first extension 138 of the light emission control line overlapping the data line 171 is positioned between the data line 171 and the scan line 151. Therefore, the first extension 138 is formed between the scan line 151 and the data line 171 to minimize the parasitic capacitor between the scan line 151 and the data line 171. It is possible to control the vertical crosstalk by minimizing the kick back voltage due to the parasitic capacitor to minimize the change in the driving gate voltage Vg of the driving gate electrode 155a.

Further, it is possible to expand the driving range of the driving gate-source voltage Vgs between the driving gate electrode 155a and the driving source electrode 136a by minimizing the kickback voltage due to the parasitic capacitor to increase the data voltage Dm. Therefore, it is possible to increase the resolution of the OLED display and improve the display quality by more elaborately controlling the gray scale of light emitted from the OLED.

The gate insulating layer 140 is formed on the semiconductor 130 to cover the semiconductor 130.

The scan line 151 including the switching gate electrode 155b and the compensation gate electrode 155c, the previous scan line 152 including the initialization gate electrode 155d, the light emission control line 153 including the operation control gate electrode 155e and the light emission control gate electrode 155f, the bypass control line 158 including the bypass gate electrode 155g, and the gate wirings 151, 152, 153, 158, and 155a including the driving gate electrode (first storage electrode) 155a, and the driving voltage line 172b are formed on the gate insulating layer 140. The gate wirings 151, 152, 153, 158, and 155a and the driving voltage line 172b can be formed in a multilayer in which metal layers formed of any one of copper (Cu), copper alloy, aluminum (Al), aluminum alloy, molybdenum (Mo), and molybdenum alloy are stacked.

The interlayer insulating layer 160 is positioned on the gate wirings 151, 152, 153, 158, 155a, 55, and 56, the driving voltage line 172b, and the gate insulating layer 140 to cover the gate wires 151, 152, 153, 158, 155a, 55, and 56, the driving voltage line 172b, and the gate insulating layer 140. The interlayer insulating layer 160 can be formed of silicon nitride (SiNx), silicon oxide $SiO_2$, or the like.

The contact holes 61, 62, 63, 64, 65, 66, 67, and 68 are formed on the interlayer insulating layer 160.

The data line 171, the driving voltage line 172a including the second storage electrode 178, and the data wirings 171, 172, 174, 175, 178, and 179 including the driving connecting member 174, the initialization connecting member 175, and the light emission control connecting member 179 are formed on the interlayer insulating layer 160. The data wirings 171, 172a, 174, 175, 178, and 179 can be formed in a multilayer in which a metal layer including any one of copper (Cu), copper alloy, aluminum (Al), aluminum alloy, molybdenum (Mo), and molybdenum alloy is stacked, for example, a triple layer of titanium/aluminum/titanium (Ti/Al/Ti), molybdenum/aluminum/molybdenum (Mo/Al/Mo) or molybdenum/copper/molybdenum (Mo/Cu/Mo), and the like.

The data line 171 is connected to the switching source electrode 136b through the contact hole 62 which is formed on the gate insulating layer 140 and the interlayer insulating layer 160. The first driving voltage line 172a is partially extended to form the second storage electrode 178.

An end of the driving connecting member 174 is connected to the first storage electrode 155a through the contact hole 61 formed on the interlayer insulating layer 160. The other end of the driving connecting member 174 is connected to the compensation drain electrode 137c and the initialization drain electrode 137d through the contact hole 63 which is formed on the gate insulating layer 140 and the interlayer insulating layer 160.

The initialization connecting member 175 is connected to the initialization source electrode 136d through the contact hole 64 which is formed on the gate insulating layer 140 and the interlayer insulating layer 160. The light emission control connecting member 179 is connected to the light emission control drain electrode 137f through the contact hole 66 which is formed on the gate insulating layer 140 and the interlayer insulating layer 160.

A passivation layer 180 is formed on the data wirings 171, 172, 174, 175, 178, and 179 and the interlayer insulating layer 160 to cover the data wirings 171, 172, 174, 175, 178, and 179 and the interlayer insulating layer 160. The passivation layer 180 covers and planarizes the data wirings 171, 172, 174, 175, 178, and 179 and therefore the pixel electrode 191 can be formed on the passivation layer 180 without a step. The passivation layer 180 can be formed of an organic material such as polyacrylates resin, polyimides resin, or the like or a stacked layer of an organic material and an inorganic material.

The pixel electrode 191 and an initialization voltage line 192 are formed on the passivation layer 180. The light emission control connecting member 179 is connected to the pixel electrode 191 through the contact hole 81 which is formed on the passivation layer 180 and the initialization connecting member 175 is connected to the initialization voltage line 192 through the contact hole 82 which is formed on the passivation layer 180.

A pixel defined layer (PDL) 350 is formed on the passivation layer 180, the initialization voltage line 192, and an edge of the pixel electrode 191 to cover the passivation layer 180, the initialization voltage line 192, and the edge of the pixel electrode 191. The pixel defined layer 350 has a pixel opening 351 through which the pixel electrode 191 is exposed. The pixel defined layer 350 can be formed of organic materials such as polyacrylates resin, polyimides resin, and the like and silica-based inorganic materials.

An organic emission layer 370 is positioned on the pixel electrode 191 exposed through the pixel opening 351 and the common electrode 270 is positioned on the organic emission layer 370. The common electrode 270 is also formed on the pixel defined layer 350 and thus is formed over the pixels PXs. As such, the OLED including the pixel electrode 191, the organic emission layer 370, and the common electrode 270 is formed.

Here, the pixel electrode 191 is an anode which is a hole injection electrode and the common electrode 270 is a cathode which is an electron injection electrode. However, the exemplary embodiment is not necessarily limited thereto and depending on a driving method of the foldable display device, the pixel electrode 191 can be the cathode and the common electrode 270 can be the anode. Holes and electrons are each injected from the pixel electrode 191 and the common electrode 270 into the organic emission layer 370 and light is emitted when excitons which is a combination of the injected holes and electrons falls from an excited state to a ground state The organic emission layer 370 can be formed of a low molecular organic material or a high molecular organic material such as poly 3,4-ethylenedioxythiophene (PE-DOT), or the like. Further, the organic emission layer 370 is formed of a multilayer which includes at least one of a light emitting layer, a hole injection layer (HIL), a hole transporting layer (HTL), an electron transporting layer (ETL), and an electron-injection layer (EIL). When including them, the hole injection layer is formed on the pixel electrode 191 which is an anode and the hole transporting layer, the light emitting layer, the electron transporting layer, and the electron injection layer are sequentially stacked thereon.

The organic emission layer 370 can include a red organic emission layer which emits red light, a green organic emission layer which emits green light, and a blue organic emission layer which emits blue light. The red organic emission layer, the green organic emission layer, and the blue organic emission layer are each formed in a red pixel, a green pixel, and a blue pixel to implement a color image.

Further, the organic emission layer 370 can implement the color image by stacking the red organic emission layer, the green organic emission layer, and the blue organic emission layer in all of the red pixel, the green pixel, and the blue pixel and forming a red color filter, a green color filter, and a blue color filter for each pixel. As another example, the color image is implemented by forming a white organic emission layer which emits white light in all of the red pixel, the green pixel, and the blue pixel and forming the red color filter, the green color filter, and the blue color filter for each pixel. At the time of implementing the color image using the white organic emission layer and the color filters, there is no need to use a deposition mask for depositing the red organic emission layer, the green organic emission layer, and the blue organic emission layer on each pixel, that is, the red pixel, the green pixel, and the blue pixel.

The white organic emission layer described in another example can be formed of a single organic emission layer and can be configured to emit white light by stacking the organic emission layers. For example, the white organic emission layer also includes a configuration to emit white light by combining at least one yellow organic emission layer with at least one blue organic emission layer, a configuration to emit white light by combining at least one cyan organic emission layer with at least one red organic emission layer, and a configuration to emit white light by combining at least one magenta organic emission layer with at least one green organic emission layer, and the like.

An encapsulation member (not illustrated) protecting the OLED can be formed on the common electrode 270 and the encapsulation member can be encapsulated on the substrate 110 by a sealant and can be formed of various materials such as glass, quartz, ceramic, plastic, metal, and the like. Meanwhile, an organic layer and inorganic layer can be deposited on the common electrode 270 without the sealant to form a thin film encapsulation layer.

Figure 8:
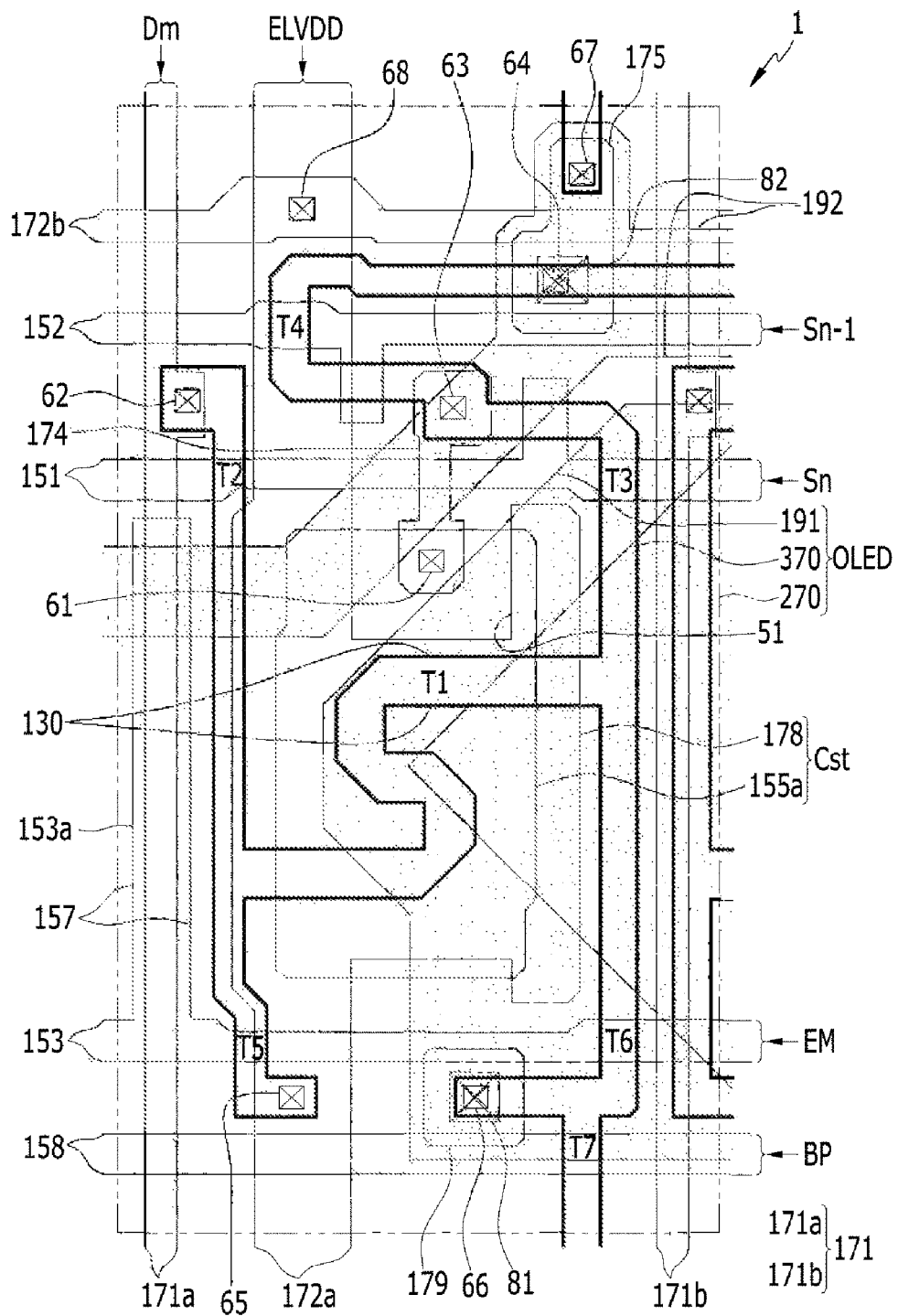
FIGS. 8 and 9 are diagrams schematically illustrating a plurality of transistors and a capacitor of an OLED display according to another exemplary embodiment.

Hereinafter, an OLED display according to another exemplary embodiment will be described with reference to FIGS. 8 and 9. FIG. 8 is a diagram schematically illustrating a plurality of transistors and a capacitor of an OLED display according to another exemplary embodiment. Hereinafter, the same components as those of the foregoing OLED display will be omitted.

Referring to FIG. 8, the light emission control line EM which is positioned on the same layer as the scan line includes an extension. The second extension 157 extends in a length direction of the data line 171 to overlap the data line 171. A portion of the data line 171 overlaps the light emission control line EM.

In this case, a width of the second extension 157 can be wider than that of the data line 171. That is, the width of the data line 171 can be narrower than that of the second extension 157, and the data line 171 can completely overlap the second extension 157 in a width direction.

Meanwhile, the parasitic capacitor Ca occurs between the data line 171 and the scan line 151 and the parasitic capacitor Ca changes the driving gate voltage Vg of the driving gate electrode 155a to affect luminance, thereby generating the vertical crosstalk.

However, according to another exemplary embodiment, the second extension 157 of the light emission control line overlapping the data line 171 is positioned between the data line 171 and the scan line 151. Therefore, the second extension 157 blocks between the scan line 151 and the data line 171 to minimize the parasitic capacitor between the scan line 151 and the data line 171. It is possible to control the vertical crosstalk by minimizing the kick back voltage due to the parasitic capacitor to minimize the change in the driving gate voltage Vg of the driving gate electrode 155a.

Further, it is possible to expand the driving range of the driving gate-source voltage Vgs between the driving gate electrode 155a and the driving source electrode 136a by minimizing the kickback voltage due to the parasitic capacitor to increase the data voltage Dm. Therefore, it is possible to increase the resolution of the OLED display and improve the display quality by more elaborately controlling the gray scale of light emitted from the OLED.

Figure 9:
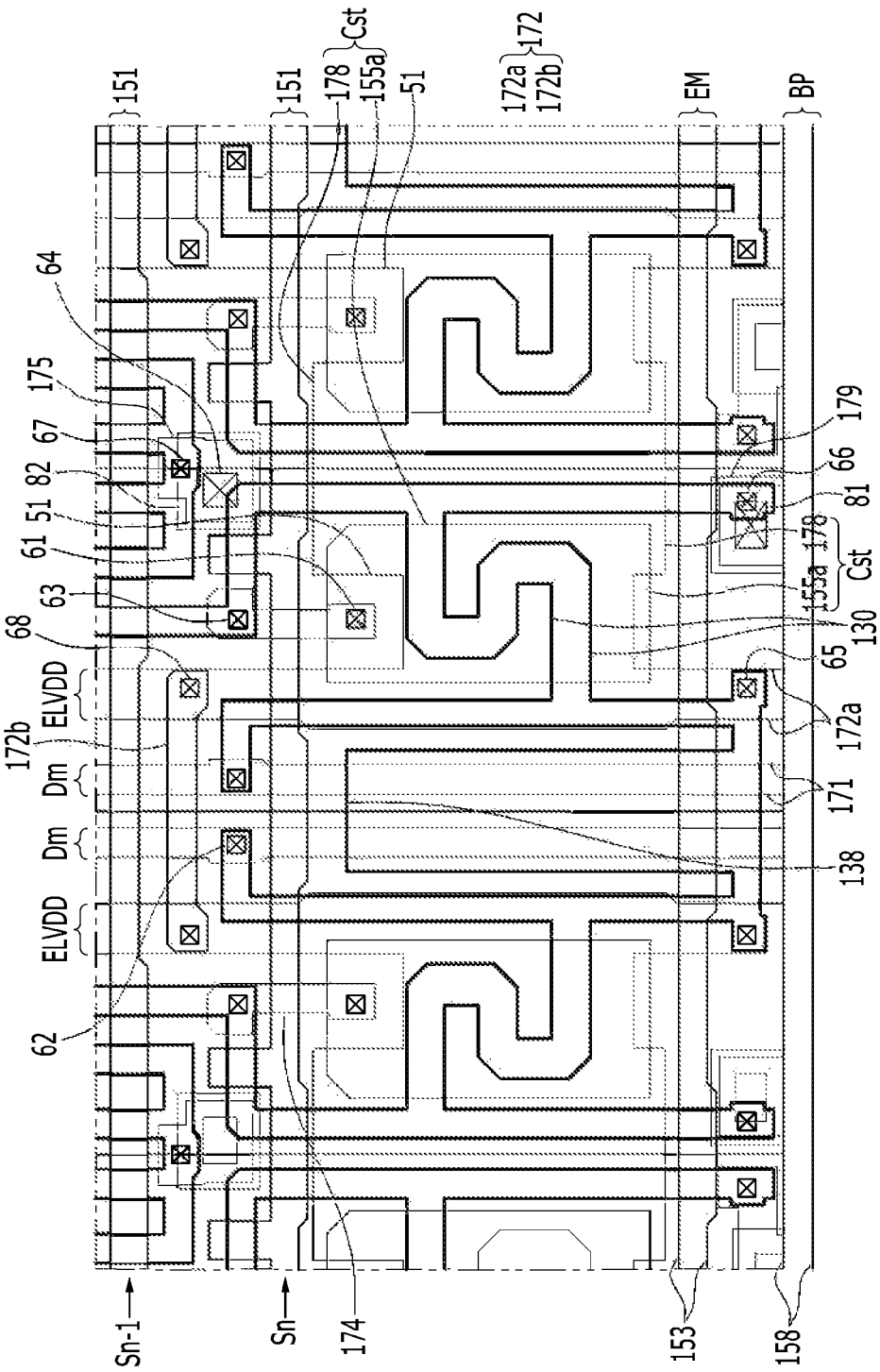

Next, referring to FIG. 9, a channel 131 which is formed in the semiconductor 130 includes a driving channel 131a which is formed in the driving transistor T1, a switching channel 131b which is formed in the switching transistor T2, a compensation channel 131c which is formed in the compensation transistor T3, an initialization channel 131d which is formed in the initialization transistor T4, an operation control channel 131e which is formed in the operation control transistor T5, a light emission control channel 131f which is formed in the light emission control transistor T6, and a bypass channel 131g which is formed in the bypass transistor T7.

As illustrated in FIG. 9, the semiconductor 130 according to another exemplary embodiment includes a first extension 138 which overlaps the data line 171. The first extension 138 extends in a length direction of the data line 171 to overlap the data line 171. That is, a portion of the data line 171 overlaps the semiconductor 130. In this case, the first extension 138 can extend from the operation control source electrode S5.

The width of the first extension 138 can be greater than that of the data line 171. For example, the width of the data line 171 is narrower than that of the first extension 138 and the data line 71 can completely overlap the first extension 138 in a width direction.

Further, according to another exemplary embodiment, in both pixels adjacent to each other, components such as the scan line, the light emission control line, the data line, and the driving voltage line are formed in a y-axis symmetry. Therefore, the first extension 138 according to another exemplary embodiment can be positioned to overlap all the data lines 171 which are positioned at both pixels adjacent to each other. That is, a pixel which is positioned in an n-th column and a pixel which is an n+1-th column can share one first extension 138 and the first extension 138 can overlap each of the data lines included in each pixel.

Meanwhile, the parasitic capacitor Ca occurs between the data line 171 and the scan line 151 and the parasitic capacitor Ca changes the driving gate voltage Vg of the driving gate electrode 155a to affect luminance, thereby generating the vertical crosstalk.

However, according to the exemplary embodiment, the first extension 138 of the semiconductor 130 overlapping the data line 171 is positioned between the data line 171 and the scan line 151. Therefore, the first extension 138 is formed between the scan line 151 and the data line 171 to minimize the parasitic capacitor between the scan line 151 and the data line 171. It is possible to control the vertical crosstalk by minimizing the kick back voltage due to the parasitic capacitor to minimize the change in the driving gate voltage Vg of the driving gate electrode 155a Further, it is possible to expand the driving range of the driving gate-source voltage Vgs between the driving gate electrode 155a and the driving source electrode 136a by minimizing the kickback voltage due to the parasitic capacitor to increase the data voltage Dm. Therefore, it is possible to increase the resolution of the OLED display and improve the display quality by more elaborately controlling the gray scale of light emitted from the OLED.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
   a substrate;
   a semiconductor layer disposed over the substrate;
   a scan line disposed over the semiconductor layer and configured to provide a scan signal;
   a light emission control line disposed over the semiconductor layer and configured to provide a light emission control signal;
   a data line configured to provide a data voltage;
   a driving voltage line configured to provide a driving voltage, wherein the driving voltage line crosses the scan line and is electrically insulated from the scan line;
   a switching transistor electrically connected to the scan line and the data line and including a switching drain electrode;
   a driving transistor including a driving source electrode electrically connected to the switching drain electrode; and
   an OLED configured to receive the driving voltage from the driving transistor,
   wherein any one of the semiconductor layer and the light emission control line includes an extension extending along an extending direction of the data line, and wherein the extension between the scan line and the light emission control line overlaps the data line.

2. The OLED display of claim 1, wherein the width of the extension is greater than that of the data line.

3. The OLED display of claim 1, wherein the extension crosses the light emission control line.

4. The OLED display of claim 1, wherein the semiconductor layer is electrically connected to the driving voltage line.

5. The OLED display of claim 1, wherein the semiconductor layer includes a switching channel of the switching transistor and a driving channel of the driving transistor.

6. The OLED display of claim 1, further comprising:
   a first gate insulating layer disposed over the semiconductor layer;
   a first storage electrode disposed over the first gate insulating layer and overlapping the driving channel in the depth dimension of the OLED display;
   a second gate insulating layer disposed over the first storage electrode; and
   a second storage electrode disposed over the second gate insulating layer and overlapping the first storage electrode in the depth dimension of the OLED display,
   wherein the first storage electrode includes a driving gate electrode of the driving transistor, and wherein the driving transistor overlaps the second storage electrode.

7. The OLED display of claim 6, further comprising an interlayer insulating layer disposed over the second storage electrode, wherein the data line is disposed over the interlayer insulating layer.

8. The OLED display of claim 7, further comprising a passivation layer disposed over the data line, wherein the OLED includes:

a pixel electrode disposed over the passivation layer;
an organic emission layer disposed over the pixel electrode; and
a common electrode disposed over the organic emission layer.

9. The OLED display of claim 1, further comprising a compensation transistor configured to be turned on based on the scan signal to compensate for a threshold voltage of the driving transistor, wherein the compensation transistor is electrically connected to a driving drain electrode of the driving transistor.

10. The OLED display of claim 1, further comprising an operation control transistor configured to receive the light emission control signal and configured to be turned on to transfer the driving voltage to the driving transistor.

11. The OLED display of claim 10, wherein the operation control transistor includes:
a portion of the light emission control line configured to function as an operation control gate electrode of the operation control transistor;
an operation control channel overlapping the operation control gate electrode in the depth dimension of the OLED display and disposed over the semiconductor layer; and
operation control source and drain electrodes disposed over the semiconductor layer and located on different sides of the operation control channel.

12. The OLED display of claim 1, wherein the extension does not overlap the scan line in the depth dimension of the OLED display.

13. An organic light-emitting diode (OLED) display, comprising:
a semiconductor layer;
a scan line disposed over the semiconductor layer and configured to provide a scan signal;
a data line configured to provide a data voltage;
an OLED configured to receive a driving voltage,
wherein the semiconductor layer includes an extension overlapping the data line along an extending direction of the data line and not overlapping the scan line.

14. The OLED display of claim 13, wherein the width of the extension is greater than that of the data line.

15. The OLED display of claim 14, further comprising an operation control transistor including an operation control gate electrode disposed on the same layer as the first extension.

16. The OLED display of claim 15, wherein the operation control gate electrode has a width less than the width of the extension.

17. The OLED display of claim 14, wherein the extension extends from the semiconductor layer and is substantially parallel to the data line.

18. The OLED display of claim 13, further comprising a plurality of driving voltage lines disposed on a same layer as the data line, wherein the data lines in adjacent pixels are disposed between adjacent driving voltage lines.

19. The OLED display of claim 18, wherein the extension overlaps the data lines in adjacent pixels.

20. The OLED display of claim 13, further comprising a plurality of pixels, wherein adjacent pixels of the pixels are symmetric about a y-axis.

* * * * *